United States Patent [19]

Adams et al.

[11] Patent Number: 4,782,250

[45] Date of Patent: Nov. 1, 1988

[54] CMOS OFF-CHIP DRIVER CIRCUITS

[75] Inventors: Robert D. Adams, Essex Junction; Roy C. Flaker, Essex; Kenneth S. Gray, Jericho; Howard L. Kalter, Colchester, all of Vt.

[73] Assignee: International Business Machines Corporation, Armonk, N.Y.

[21] Appl. No.: 91,565

[22] Filed: Aug. 31, 1987

[51] Int. Cl.[4] .............. H03K 19/017; H03K 19/096; H03K 17/687; H03K 17/04

[52] U.S. Cl. .................................. 307/473; 307/475; 307/270; 365/168

[58] Field of Search ............... 307/448, 451, 473, 270, 307/585; 365/168

[56] References Cited

U.S. PATENT DOCUMENTS

| | | | |
|---|---|---|---|
| 4,217,502 | 8/1980 | Suzuki et al. | 307/205 |
| 4,449,065 | 5/1984 | Davies, Jr. | 307/473 |
| 4,574,273 | 3/1986 | Atsumi et al. | 307/475 |
| 4,585,958 | 4/1986 | Chung et al. | 307/473 |
| 4,620,310 | 10/1986 | Lvovsky et al. | 307/473 X |
| 4,656,372 | 4/1987 | Sani et al. | 307/473 X |
| 4,697,110 | 9/1987 | Masuda et al. | 307/448 X |
| 4,728,822 | 3/1988 | Kusaka et al. | 307/448 |

Primary Examiner—Stanley D. Miller
Assistant Examiner—David R. Bertelson
Attorney, Agent, or Firm—Stephen J. Limanek

[57] ABSTRACT

A CMOS off-chip driver circuit is provided which includes a first P-channel field effect transistor arranged in series with a second or pull-up P-channel transistor and a third P-channel transistor connected from the common point between the first and second transistors and the gate electrode of the first transistor. The first and second transistors are disposed between a data output terminal and a first voltage source having a supply voltage of a given magnitude, with the data output terminal also being connected to a circuit or system including a second voltage source having a supply voltage of a magnitude significantly greater than that of the given magnitude. In a more specific aspect of this invention, a fourth P-channel transistor, disposed in a common N-well with the other P-channel transistors, is connected at its source to the first voltage source and at its drain to the common N-well, with its gate electrode being connected to the data output terminal.

18 Claims, 2 Drawing Sheets

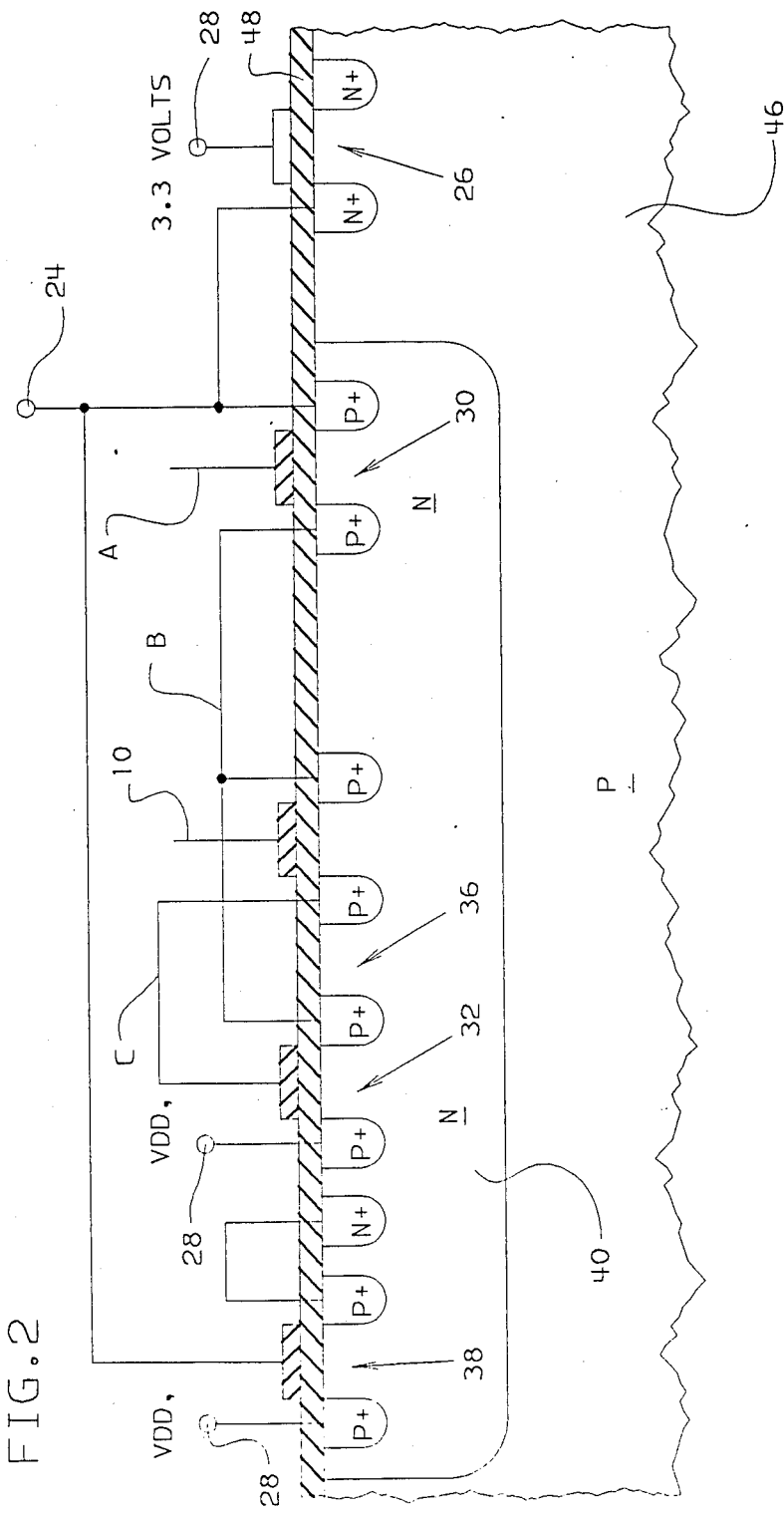

CMOS OFF-CHIP DRIVER CIRCUITS

TECHNICAL FIELD

This invention relates to off-chip driver circuits and, more particularly, to a CMOS off-chip driver circuit which is part of a system wherein the input circuit to the off-chip driver circuit is designed in a lower supply voltage environment than is the circuit to which the output of the off-chip driver circuit is connected.

BACKGROUND ART

Reduced scaling or shrinking of the geometries of devices used in integrated semiconductor circuit technology for forming denser circuits has required voltage supply sources to provide lower voltages than the heretofore generally accepted standard supply voltage of 5 volts so as to avoid a voltage breakdown in the insulation layers of the smaller devices. During the transition from 5 volt supplies to the lower voltage supplies of, say, 3.3 volts, a mix of circuits is being used wherein some of the circuits haee been designed for use with standard 5 volt supplies while other circuits have been designed for use with the lower 3.3 volt supplies. In general, the geometries of memory circuits are reduced at a faster rate than are the geometries of logic circuits which are coupled to the memory circuits. In particular, complementary metal oxide semiconductor (CMOS) random access memories are currently being designed in about 3.3 volt supply technology, whereas logic circuits, such as those of the transistor-transistor logic (TTL) type, which receive the output signals or data from the memories, are still being designed in a 5 volt supply technology. With these low voltage memory circuits feeding into the high voltage logic circuits through off-chip drivers, excessive voltage stress is encountered in the thin insulation or oxide layers of some of the devices in the off-chip drivers which form the interface between the memory and logic circuits, and, furthermore, undesirable current leakage paths are created therein resulting in a power loss and also at times in serious CMOS latch up problems. It is known that the upper limit of gate oxide field strength, e.g., of silicon dioxide, is about 3 megavolts per centimeter and, therefore, the maximum allowable voltage across a gate oxide of about 150 angstroms thickness which is often used today in low voltage technology devices is approximately 4.5 volts.

In U.S. Pat. No. 4,585,958, filed Dec. 30, 1983, there is disclosed a CMOS driver circuit having a P-channel pull up device and an N channel pull down device with a NAND circuit and a NOR circuit connected to the gate electrodes of the pull up and pull down devices, respectively.

U.S. Pat. No. 4,217,502, filed Sept. 11, 1978 discloses a circuit similar to that of the hereinabove identified U.S. Pat. No. 4,585,958 but additionally provides voltage control of the P-channel transistor substrate.

U.S. Pat. No. 4,574,273, filed Nov. 4, 1983, discloses a voltage converter circuit which uses two power supply voltages, one at +5 volts and another at +21 volts.

DISCLOSURE OF THE INVENTION

It is an object of this invention to provide an improved CMOS off-chip driver circuit which interfaces between a first circuit with a given supply voltage and a second circuit with a supply voltage having a magnitude greater than that of the given supply voltage without producing an excessive voltage stress on insulation or oxide layers in any of the devices of the circuits and with minimum or no current leakage paths, particularly into the semiconductor substrate to avoid CMOS latch up problems.

In accordance with the teachings of this invention, a CMOS off-chip driver circuit is provided which includes a first P-channel field effect transistor arranged in series with a second or pull up P-channel transistor and a third P-channel transistor connected from the common point between the first and second transistors and the gate electrode of the first transistor, the first, second, and third transistors being located in a common N-well. The first and second transistors are disposed between a data output terminal and a first voltage source having a supply voltage of a given magnitude, with the data output terminal also being connected to a circuit including a second voltage source having a supply voltage of a magnitude significantly greater than that of the given magnitude. In a more specific aspect of this invention, a fourth P-channel transistor, disposed in the common N-well, is connected at its source to the first voltage source and at its drain to the common N-well, with its gate electrode being connected to the data output terminal. The circuit of the present invention may also include a pull down device serially connected with a pass device disposed between the data output terminal and a point of reference potential, such as ground, the pass device being disposed between the data output terminal and the pull down device. The pull down device and the pass device are preferably N-channel field effect transistors.

The foregoing and other objects, features and advantages of the invention will be apparent from the following more particular description of the preferred embodiments of the invention, as illustrated in theaccompanying drawing.

BRIEF DESCRIPTION OF THE DRAWING

FIG. 2 is a sectional view taken through a semiconductor substrate of P-channel field effect transistors, along with one N-channel field effect transistor, of a portion of the circuit illustrated in FIG. 1.

BEST MODE FOR CARRYING OUT THE INVENTION

Figure 1:
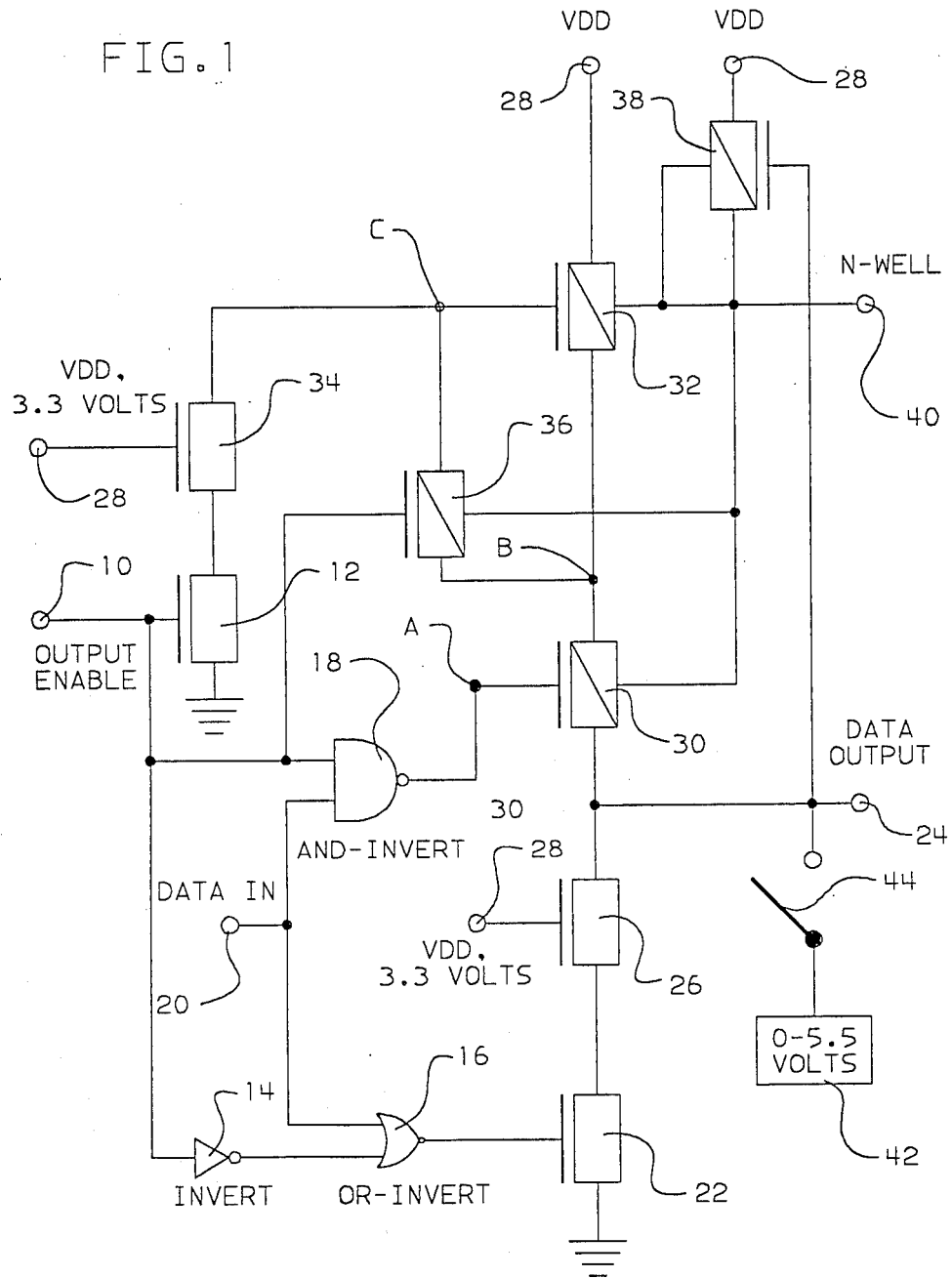
FIG. 1 is a circuit diagram of a preferred embodiment of the present invention.

Referring to FIG. 1 of the drawing in more detail, there is shown a circuit diagram of a preferred embodiment of the CMOS off-chip driver circuit of the present invention. The circuit, being made in the CMOS technology, has its P-channel field effect transistors indicated by a rectangle with a diagonal line formed therein and a gate electrode arranged adjacent thereto and its N-channel field effect transistors indicated by a rectangle without a diagonal line and a gate electrode arranged adjacent thereto.

The CMOS off-chip driver circuit of the present invention illustrated in FIG. 1 includes an output enable terminal 10 connected to the gate electrode of an input transistor 12 and to an input of an INVERT circuit 14, with the output of the INVERT circuit 14 being connected to a first input of an OR-INVERT circuit 16. The output enable terminal 10 is also connected to a first input of an AND-INVERT circuit 18. A data in terminal 20 is connected to a second input of the OR- INVERT circuit 16 and to a second input of the AND-INVERT circuit 18. The output of the OR-INVERT circuit 16 is connected to the gate electrode of a pull down transistor 22 which is disposed between a data output terminal 24 and a point of reference potential, such as, ground. An N-channel transistor 26, acting as a first pass transistor, is disposed between the data output terminal 24 and the pull down transistor 22. The first pass transistor 26 has its gate electrode connected to a first voltage source 28, VDD, having a supply voltage of a given magnitude, such as, 3.3 volts. Input transistor 12, pull down transistor 22 and pass transistor 26 are preferably of the N-channel field effect type. The OR-INVERT circuit 16 may simply be an OR circuit followed by an inverter and the AND-INVERT circuit 18 may be an AND circuit followed by an inverter.

A pull up transistor 30 is disposed between the data output terminal 24 and the first voltage source 28, and a switching transistor 32 is disposed between the first voltage source 28 and the pull up transistor 30. The gate electrode of the pull up transistor 30 is connected to the output of the AND-INVERT circuit 18 through node A, and the gate electrode of the switching transistor 32 is connected to the input transistor 12 through node C and a second pass transistor 34 which has its gate electrode connected to VDD, the first voltage source 28. A control transistor 36 is connected from the gate electrode of the switching transistor 32 to node B, the common point between the pull up transistor 30 and the switching transistor 32. The gate electrode of the control transistor 36 is connected to the output enable terminal 10. An N-well bias transistor 38 is connected between the first voltage source 28, VDD, and a common N-well 40, with its gate electrode being connected to the data output terminal 24. The pull-up transistor 30, the switching transistor 32, the control transistor 36 and the N-well bias transistor 38 are P-channel field effect transistors disposed in the common N-well 40, as can be seen more clearly in FIG. 2 of the drawing, which will be discussed hereinbelow in more detail.

An external circuit or system, which may be a transistor-transistor logic (TTL) circuit having a second voltage source, sometimes known as VH, with a supply voltage of about 5 volts, indicated by block 42, is selectively connectable by any appropriate means, such as switching means 44, to the data output terminal 24. The external circuit or system 42 is generally formed on a separate semiconductor chip and may have voltages which range from 0 to 5.5 volts.

Referring to FIG. 2 of the drawing in more detail, wherein similar elements have like reference numerals or characters to those indicated in FIG. 1, there is disclosed in cross-sectional view through a P-type semiconductor substrate 46, the P-channel transistors 30, 32, 36 and 38 disposed in the common N-well 40, with the N-channel transistor 26 being formed in the P-type substrate 46. A gate oxide 48, preferably a thin layer of silicon dioxide, is grown on the surface of the substrate 46 to separate the gate electrodes of the transistors, such as transistors 26,30,32,36 and 38, from the surface of the substrate 46. As is known, the sources and drains of the P-channel transistors may be made by using diffusion or ion implant techniques with, e.g., boron as the impurity, to form the P+ regions in the common N-well 40, and the sources and drains of the N-channel transistors may be made by using these techniques with arsenic or phosphorous impurities to form the N+ regions in the P-type semiconductor substrate 46. A contact to the common N-well 40 is made by forming an N+ region in the N-well.

In the operation of the CMOS off-chip driver circuit of the present invention illustrated in FIGS. 1 and 2 of the drawing, to apply binary digit information, i.e., a 0 or a 1, which is indicated by 0 or 3.3 volts, respectively, to the data output terminal 24 from the data in terminal 20, a voltage of 3.3 volts is applied to the output enable terminal 10. With the terminal 10 at 3.3 volts, i.e., at a high voltage, the voltage at the first input of the AND-INVERT circuit 18 is also high and the voltage at the first input of the OR-INVERT circuit 16 is low, i.e., at 0 volts, after passing through INVERT circuit 14.

Accordingly, if the data in terminal 20 is high, the voltage at node A is low and, thus, P-channel pull up transistor 30 turns on. Since the 3.3 volts turns on N-channel input transistor 12, the second pass transistor 34 will also be turned on to discharge node C to ground turning on switching transistor 32. With transistors 30 and 32 turned on, the voltage on the data output terminal goes high to 3.3 volts, along with node B. Also, the high voltage on data in terminal 20 produces a low voltage at the gate electrode of the pull down transistor 22 to turn off transistor 22. If the data in terminal 20 is low, i.e., a 0 digit, node A goes high turning off the pull up transistor 30 and the voltage at the gate electrode of the pull down transistor 22 goes high turning on transistor 22 to discharge the data output terminal 24 through the first pass transistor 26 and the pull down transistor 22 toward ground. With the data in terminal 20 high, the voltage at the data output terminal 24 is high, representing a first output state, and, with data in terminal 20 low, the voltage at the data output terminal 24 is low, representing a second output state.

The circuit of the present invention is also capable of having a high impedance state, or tristate, at the data output terminal 24 at a time when it is desired to connect the external circuit or system 44 to the data output terminal 24. In order to place the circuit of the present invention in tristate, the voltage at the output enable terminal 10 is reduced to ground which turns off the input transistor 12, produces a high voltage at node A turning off pull up transistor 30, produces a low voltage at the gate electrode of the N-channel pull down transistor 22 turning off transistor 22 and turns on the P-channel transistor 36 to equalize voltages at nodes B and C. With both the pull up and pull down transistors 30 and 22, respectively, turned off, the switch 44 may be closed to apply the range of voltages 0 to 5.5 volts from the external circuit or system 42 to the data output terminal or bus 24 without causing undue stress, current leakage or latchup in the CMOS driver circuit of the present invention.

Since the CMOS driver circuit of the present invention was designed to operate at voltages from 0 to 3.3 volts, it is obvious that the application of voltages up to 3.3 volts on the data output terminal 24 from the external circuit or system 42 will not produce a problem within the driver circuit. More importantly, however, the circuit of the present invention will also satisfactorily withstand voltages having magnitudes outside of the design ranges, even to the full range of voltages, i.e., up to 5.5 volts, applied to the data output terminal 24 from the external circuit or system 42. Since the thin gate oxide disposed between the drain and gate electrode and between the source and gate electrode of the P-channel and N-channel transistors has been designed to withstand voltages of 3.3 volts, and even as high as about 3.5 to 4 volts, but not higher, a 5 volt system, as indicated by block 42 of FIG. 1, sharing a common terminal or bus with a conventional off-chip driver circuit operating at 3.3 volts could cause irreparable damage to the off-chip driver circuit.

When a voltage is applied to the data output terminal 24 which exceeds the 3.3 volts applied to the gate electrode of the pull up transistor 30 by a P-channel threshold voltage of, say, 0.7 volt, transistor 30 will turn on to apply the voltage on terminal 24 to node B and, since control transistor 36 is turned on with the 0 volts applied to its gate electrode, the high voltage on data output terminal 24 is also applied to node C turning off switching transistor 32 to prevent current from leaking into the first voltage source 28, VDD. The N-well 40 of the transistors 30, 32 and 36 is self-biased through the parasitic pn junctions formed between the drains of the transistors 30, 32, and 36 and the N-well 40 to eliminate current feedback through the parasitic pnp transistors which include the N-well 40 and the P-type semiconductor substrate 46, indicated in FIG. 2 of the drawing. If desired, the N-well 40 may be biased by a separate N-well pump circuit which will not permit the N-well 40 to be forward biased when the driver circuit is in tristate and 5 volts is applied to the terminal 24. The first and second pass transistors 26 and 34 are provided to avoid excessive gate oxide stress on the pull down transistor 22 and the input transistor 12.

The gate oxide of the P-channel transistor 36 appears to be overly stressed with 0 volts on the gate electrode 30 and 5 volts on node B, however, this transistor 36 is preferably made with an N-type doped polysilicon gate electrode which provides a work function producing about +1 volt across this gate oxide and causing a voltage differential of only 4 volts or less across the oxide.

If it is desired to further reduce the stress on the gate electrode of transistor 36, the gate electrode of transistor 36 could be disconnected from the terminal 10 and connected to a second and separate output enable terminal. This added output enable terminal would function exactly in the same manner as terminal 10 except that the down level at this second terminal would be more positive than ground.

By providing the common N-well biasing transistor 38, the N-well 40 is biased to the supply voltage Vdd whenever the voltage at the output terminal 24 is at a low level. This minimizes the likelihood of a parasitic pnp transistor turning on during any transition at the output terminal 24 from a low level to a high level, but still allows the N-well 40 to float to 5 volts when in tristate and the output at terminal 24 is driven to 5 volts. This arrangement provides a 3.3 volt technology tristate off-chip driver circuit without undue oxide stress problems that can communicate with a 5 volt TTL bus without causing parasitic pnp transistor problems.

If desired, the P-channel pull-up transistor 30 may be disposed within a separate or second N-well connected to the source of transistor 30 so that whenever the P-channel switching transistor 32 is on, the second N-well would be connected to the supply voltage VDD.

While the inventions have been particularly shown and described with reference to preferred embodiments thereof, it will be understood by those skilled in the art that various changes in form and details may be made therein without departing from the spirit and scope of the invention.

What is claimed is:

1. An off-chip driver circuit comprising
   a pull-up transistor,
   a pull-down transistor,
   voltage source means for providing a supply voltage of a given magnitude,
   a first transistor connected between said voltage source means and said pull-up transistor,
   an output terminal, said first transistor and said pull-up transistor being serially connected between said output terminal and said voltage source means,
   a second transistor connected from a gate electrode of said first transistor to a common point between said first transistor and said pull-up transistor,
   means for applying control voltages to the gate electrodes of said transistors, and
   means for selectively applying a voltage to said output terminal having a magnitude significantly greater than that of said given magnitude.

2. An off-chip driver circuit as set forth in claim 1 wherein said pull-up, first and second transistors are P-channel field effect transistors.

3. An off-chip driver circuit as set forth in claim 2 further including a third transistor disposed between said pull-down transistor and said output terminal, said pull-down and third transistors being N-channel field effect transistors.

4. An off-chip driver circuit as set forth in claim 3 wherein a gate electrode of said third transistor has applied thereto said supply voltage of given magnitude.

5. An off-chip driver circuit as set forth in claim 2 further including an N-well, said pull-up, first and second transistors being disposed within said N-well and a third P-channel field effect transistor connected between said voltage source means and said N-well with a gate electrode connected to said output terminal.

6. A CMOS off-chip driver circuit comprising
   a voltage source means for providing a supply voltage of a given magnitude,
   an output terminal,
   first and second P-channel field effect transistors serially connected between said voltage source means and said output terminal, said second transistor being disposed between said first transistor and said voltage source means,
   a third P-channel field effect transistor connected from a gate electrode of said second transistor to a common point between said first and second transistors,
   voltage pull-down means connected between said output terminal and a point of reference potential,
   means for applying control voltages to the gate electrodes of said transistors, and
   means for selectively applying a voltage to said output terminal having a magnitude significantly greater than that of said given magnitude.

7. A CMOS off-chip driver circuit as set forth in claim 6 further including an N-well, said first, second and third transistors being disposed within said N-well and a fourth P-channel field effect transistor disposed within said N-well having a source connected to said voltage source means, a drain connected to said N-well and a gate electrode connected to said output terminal.

8. A CMOS off-chip driver circuit as set forth in claim 6 wherein said pull-down means includes an N-channel field effect transistor disposed between said output terminal and said point of reference potential, said control voltage applying means applies voltage to the gate electrodes of said transistors so as to place said output terminal in a high voltage state during a first time interval, in a low voltage state during a second time interval and in a high impedance state during a third time interval and said selectively applying voltage means applying said voltage of a magnitude significantly greater than that of said given magnitude during said third time interval.

9. A CMOS off-chip driver circuit comprising
voltage source means for providing a supply voltage of a given magnitude,
a data output terminal,
first, second and third P-channel field effect transistors each having a gate electrode, said first and second transistors being serially connected between said voltage source means and said data output terminal with the source of said second transistor being connected to said voltage source means and said third transistor being connected from the gate electrode of said second transistor to the common point between said first and second transistors,
first and second N-channel field effect transistors each having a gate electrode, said first and second N-channel transistors being serially connected between said data output terminal and a point of reference potential with the source of said first N-channel transistor being connected to said point of reference potential and the gate electrode of said second N-channel transistor being connected to said voltage source means,
means for applying control voltages to the gate electrodes of said first, second and third P-channel transistors and to said first N-channel transistor, and
means for selectively applying a voltage to said data output terminal having a magnitude significantly greater than that of said given magnitude.

10. A CMOS off-chip driver circuit as set forth in claim 9 wherein said control voltage applying means applies voltages to the gate electrodes of said first P-channel transistor and said first N-channel transistor so as to place said data output terminal in a high voltage state during a first interval of time, in a low voltage state during a second interval of time and in a high impedance state during a third interval of time and said selectively applying voltage means applying said voltage of a magnitude significantly greater than that of said given magnitude to said data output terminal during said third interval of time.

11. A CMOS off-chip driver circuit as set forth in claim 10 wherein said control voltage applying means includes an AND-INVERT circuit having an output connected to the gate electrode of said first P-channel transistor, an OR-INVERT circuit having an output connected to the gate electrode of said first N-channel transistor and a data in terminal connected to a first input of said AND-INVERT circuit and to a first input of said OR-INVERT circuit.

12. A CMOS off-chip driver circuit as set forth in claim 11 wherein said control voltage applying means further includes
an INVERT circuit having an output connected to a second input of said OR-INVERT circuit, and
an output enable terminal connected to a second input of said AND-INVERT circuit and to an input of said INVERT circuit.

13. A CMOS off-chip driver circuit as set forth in claim 12 wherein said control voltage applying means further includes third and fourth N-channel field effect transistors serially connected between the gate electrode of said second P-channel field effect transistor and said point of reference potential, the source of said third N-channel transistor being connected to said point of reference potential, the gate electrode of said third N-channel transistor being connected to said output enable terminal and the gate electrode of said fourth N-channel transistor being connected to said voltage source means.

14. A CMOS off-chip driver circuit as set forth in claim 9 further including a common N-well, each of said P-channel transistors being disposed in said common N-well.

15. A CMOS off-chip driver circuit as set forth in claim 14 further including a fourth P-channel field effect transistor disposed in said common N-well, said fourth P-channel transistor having a source connected to said voltage source means, a drain connected to said common N-well and a gate electrode connected to said data output terminal.

16. A CMOS off-chip driver circuit as set forth in claim 9 wherein the gate electrodes of said P-channel transistors are made of a material which provides a work function producing about one volt at each of the gate electrodes of the P-channel devices.

17. A CMOS off-chip driver circuit as set forth in claim 16 wherein said material is N-type doped polysilicon.

18. A CMOS off-chip driver circuit as set forth in claim 17 wherein the supply voltage of said given magnitude is approximately 3.3 volts and the voltage having a magnitude significantly greater than that of said given magnitude is approximately 5.5 volts.

* * * * *